(12) United States Patent
Aifer et al.

(10) Patent No.: US 10,644,114 B1
(45) Date of Patent: May 5, 2020

(54) RETICULATED SHALLOW ETCH MESA ISOLATION

(71) Applicant: The Government of the United States of America, as represented by the Secretary of the Navy, Washington, DC (US)

(72) Inventors: Edward H. Aifer, Arlington, VA (US); Igor Vurgaftman, Severna Park, MD (US); Jill A. Nolde, Arlington, VA (US); Eric M. Jackson, Alexandria, VA (US); Jerry R. Meyer, Catonsville, MD (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 1162 days.

(21) Appl. No.: 14/756,417

(22) Filed: Nov. 18, 2015

(51) Int. Cl.
*H01L 29/15* (2006.01)
(52) U.S. Cl.
CPC .................... *H01L 29/15* (2013.01)
(58) Field of Classification Search
USPC ............................................. 257/20
See application file for complete search history.

(56) References Cited

U.S. PATENT DOCUMENTS

| | | | | |
|---|---|---|---|---|
| 5,793,787 A * | 8/1998 | Meyer | ................. | B82Y 20/00 372/45.01 |
| 6,013,912 A * | 1/2000 | Pautrat | ............ | H01L 27/14621 250/214.1 |
| 6,339,496 B1 * | 1/2002 | Koley | ................ | H01S 5/50 359/344 |
| 8,008,688 B2 * | 8/2011 | Hu | .................. | H01L 31/1075 257/186 |
| 10,062,794 B2 * | 8/2018 | Meyer | ............ | H01L 31/02161 |

(Continued)

OTHER PUBLICATIONS

E.A. Plis, M.N. Kutty, S. Myers, A. Rathi, E.H. Aifer, I. Vurgaftman, S. Krishna, "Performance improvement of long-wave infrared InAs/GaSb strained-layer superlattice detectors through sulfur-based passivation," Infrared Physics & Technology, vol. 55, Issues 2-3, pp. 216-219 (Mar. 2012).

S. Bogdanov, B.-M. Nguyen, A. M. Hoang, and M. Razeghi, "Surface leakage current reduction in long wave length infrared type-II InAs/GaSb superlattice photodiodes," Appl. Phys. Lett., vol. 98, No. 18, pp. 183501-1-183501-3 (May 2011).

(Continued)

*Primary Examiner* — James R Hulka
(74) *Attorney, Agent, or Firm* — US Naval Research Laboratory; Joslyn Barritt

(57) ABSTRACT

A device including an absorber layer that can be deposited on top of a bottom contact layer. Furthermore, a semi-intrinsic layer with an energy gap wider than that of the absorber layer can be deposited on top of the absorber layer. A top contact layer can be deposited on top of the semi-intrinsic layer. A conduction band and a valence band energy alignment can be positioned between the absorber layer and the top contact layer, and configured to allow photoexcited minority carriers to be collected while the flow of majority carriers from the absorber are blocked. At least one mesa can be formed by processing and removing layered materials to a depth at least near the bottom of the absorber layer. Finally, a shoulder can be formed in the at least one mesa within the semi-intrinsic layer by processing and removing the layered materials.

12 Claims, 13 Drawing Sheets

(56) References Cited

U.S. PATENT DOCUMENTS

| | | | | |
|---|---|---|---|---|
| 2002/0030198 | A1* | 3/2002 | Coman | B82Y 20/00 257/103 |
| 2008/0035846 | A1* | 2/2008 | Talghader | G01J 3/26 250/338.1 |
| 2008/0217539 | A1* | 9/2008 | Talghader | A61B 17/3478 250/340 |
| 2009/0127462 | A1* | 5/2009 | Gunapala | B82Y 20/00 250/338.4 |
| 2009/0242934 | A1* | 10/2009 | Hu | H01L 31/1075 257/186 |
| 2015/0137295 | A1* | 5/2015 | Wehner | H01L 27/14629 257/432 |
| 2017/0345958 | A1* | 11/2017 | Meyer | H01L 31/02161 |
| 2018/0019269 | A1* | 1/2018 | Klipstein | H01L 27/1443 |
| 2018/0212080 | A1* | 7/2018 | Meyer | G01N 21/552 |
| 2018/0331237 | A1* | 11/2018 | Meyer | G01N 21/552 |

OTHER PUBLICATIONS

G. Chen, B.M. Nguyen, A.M. Hoang, E.K. Huang, S.R. Darvish and M. Razeghi, "Suppression of surface leakage in gate controlled Type-II InAs/GaSb mid-Infrared photodetectors", Proc. SPIE 8268, Quantum Sensing and Nanophotonic Devices IX, 826811 (Jan. 2012).

E. H. Aifer, J. H. Warner, C. L. Canedy, I. Vurgaftman, E. M. Jackson, J. G. Tischler, S. P. Powell, K. Olver, J. R. Meyer, and W. E. Tennant, "Shallow-Etch Mesa Isolation of Graded Bandgap "W" Structured Type-II Superlattice Photodiodes," Workshop on the Physics and Chemistry of II-VI Materials (Nov. 11-13, 2008, Las Vegas NV).

S. Maimon and G.W. Wicks, "nBn detector, an infrared detector with reduced dark current and higher operating temperature", Appl. Phys. Lett. 89, 115109 (Oct. 2006).

* cited by examiner

PRIOR ART

PRIOR ART

PRIOR ART

PRIOR ART

"pBp" detector with R-SEMI etch recessing p+ contact on hole barrier

"pBp" detector with conventional SDEI etch with inversion regions on sidewalls

RETICULATED SHALLOW ETCH MESA ISOLATION

FIELD

The present disclosure relates generally to semiconductor structure designs, and more specifically, it relates to a reticulated, shallow etched mesa isolation (RSEMI) device structure.

BACKGROUND

On semiconductor surfaces, the position of the Fermi level ($E_F$) relative to its intrinsic value ($E_i$) may be significantly displaced from that in the bulk, resulting in bending of the electronic energy bands. This typically can occur when large densities of surface states, arising from unterminated bonds on the surface of the semiconductor, become occupied by carriers from the bulk because their energy is lower than the bulk Fermi level, or transfer carriers to the bulk if the surface states are occupied and at higher energy. The bands bend as the Fermi level at the surface comes into equilibrium with the bulk Fermi level, which can produce a strong internal electric field over the region of charge imbalance. In this situation, the Fermi level is considered "pinned" by surface states to its position at the surface. Surface fields and band bending can also result from trapped charge in oxide layers that are often deposited on surfaces to stabilize and protect them from the environment.

When band bending occurs along the sidewall of a diode, it can cause additional surface currents to flow under normal operating biases. Such additional current flowing in the diode is typically referred to as surface leakage. Surface leakage degrades performance in low signal level applications, such as photon sensing, because it contributes dark current and shot-noise that compete with the weak photocurrent signal. It can be particularly challenging for infrared (IR) sensors that detect photo-excited minority carriers because only a small amount of band bending is required in a narrow-gap sensor material to invert the surface and create a conducting channel that can allow carriers to bypass the junction or heterostructure barrier. The challenge is further increased in advanced infrared focal plane array applications that require smaller and smaller photodiode pixels for which the surface-to-volume ratio increases, and even small levels of surface leakage can easily become the dominant noise current.

In general, the discussion of structure designs herein, concerning both the prior art designs as well as exemplary embodiments of the disclosure, will focus on the example of an infrared heterojunction photodiode with a narrow-gap p-type absorber layer and an n-type surface channel. However, one of ordinary skill in the art will understand that the application can apply equally to the contrasting case of a diode structure with an n-type absorber and p-type inverted surface, and to photodiodes of similar architecture, but sensitive to shorter wavelengths of light. This application can also apply more generally to minority carrier heterostructure devices such as et photon-sensors that employ band offsets (barriers) instead of junctions to block majority carriers. For example, photo-sensors employing the nBn and analogous pBp geometries that are discussed below.

FIG. 1a is a schematic of a conventional photodiode mesa 100, which may be fabricated by etching the surrounding material to the bottom of the absorber region. For example, the mesa 100 may represent a single pixel within a photodiode array. Specifically, the conventional photodiode mesa 100 is an example of a heterojunction (HJ) infrared photodiode (IRPD) in which a narrow gap, moderately p-type ($10^{16}$ cm$^{-3}$) absorber layer 105 is adjacent to a wider gap lightly p-doped ($2 \times 10^{15}$ cm$^{-3}$) semi-intrinsic layer (SIL) 110. The SIL, which typically has larger energy gap than the absorber, has the function of blocking the transport of majority carriers in the absorber region from flowing across the device to create a noise current. In the case of a photodiode with a p-n junction, the SIL is the depletion region, while in the case of the nBn and pBp structures that will be discussed below; the SIL is the barrier that blocks majority carriers from flowing between the absorber and the collecting contact. After a thickness equal to just over a depletion width, the wider gap layer 110 is then heavily n-doped to form the n+ cathode 115. FIG. 1a illustrates the exemplary layers and doping levels for the conventional photodiode 100 where an individual pixel is shown electrically isolated by single deep-etch isolation (SDEI) down to the bottom p+ contact layer 120, exposing the full cross-section of the diode structure on the mesa sidewalls. FIG. 1b is a plot of the bulk conduction and valence band edges for a conventional n/p photodiode mesa 100. Specifically, the ideal equilibrium conduction and valence band edges along the growth direction (z) are shown in FIG. 1b for the bulk of the conventional photodiode mesa 100, along with the position of the Fermi level $E_F$ in thermal equilibrium.

For many infrared detector materials of interest, such as those with a lightly p-type InAs/GaInSb superlattice (T2SL) absorber region, the exposed sidewalls typically have high densities of surface states that pin the Fermi level near the minority carrier band (the conduction band in this case). This creates an n-type surface inversion layer along each exposed sidewall. FIG. 2a is a schematic of a conventional photodiode mesa 200 illustrating the sidewall inversion layers, as indicated by the shaded regions 205. As a result of the surface inversion, the device 200 is essentially unipolar near the surface and surface electrons can flow nearly unimpeded in either direction across the junction. FIGS. 2b and 2c are plots of the bulk and surface conduction and valence band edges for the conventional photodiode mesa 200, which illustrate the effect of the sidewall inversion layers. Specifically, FIG. 2b depicts the bandstructure along Path 1 (210) in the bulk, while FIG. 2c depicts the bandstructure along Path 2 (215) near the surface. The alignments in FIGS. 2b and 2c differ because the Fermi level is situated near the top of the valence band in the bulk, whereas it is situated near the bottom of the conduction band at the inverted surface.

Along Path 1 (210), well away from the sidewalls, the band diagram in FIG. 2b shows the device 200 to have the normal p-i-n bandstructure, and rectification by the diode suppresses current flow in reverse bias. However, along Path 2 (215), near the surface of the absorber where the Fermi level is pinned near the conduction band, the current flow is quite different. FIG. 2c indicates that at this location, electrons occupying the n-type inversion layer encounter very little obstacle before reaching the n+ cathode. Because the SIL is too narrow to form an appreciable space charge field, only a small barrier separates the electron sea in the cathode from that in the surface inversion layer of the absorber. This results in a low-resistance leakage path for electrons flowing in either direction that effectively short-circuits the junction.

Accordingly, in the exemplary embodiments of the disclosure described below, the purpose is to increase the path length within the SIL to interpose a large electron (in this case) barrier on the surface between the absorber and cathode layers to block the flow of electrons. Once the surface channels are effectively blocked using an exemplary embodiment of this disclosure, other excess dark current mechanisms, such as high generation-recombination rates and tunneling currents, may be addressed separately. It is also emphasized that whereas the experimentally observed suppression of leakage currents by the exemplary embodiment of this disclosure is consistent with the general framework of the surface leakage model discussed herein and illustrated in FIGS. 2b and 2c, the model itself has not been rigorously tested and confirmed, whereas the exemplary embodiments of this disclosure have been experimentally demonstrated to be effective regardless of the details of the physical model that ultimately explains its effectiveness.

In the prior art, the most direct way to reduce sidewall current from a surface inversion layer is to passivate the surface by terminating the dangling bonds with a stable and charge-neutral chemistry, followed by the deposition of a dense insulating material to protect and encapsulate the passivated surface. FIG. 3a is a schematic of a diode 300 with effective surface passivation and encapsulation mitigating the effects of surface states. A good example of a dense insulating material is given by the use of silicon dioxide on silicon, which has proven to be convenient and effective as both a passivant and encapsulant. Surface states, however, are unique to each semiconductor material, and typically require specific chemistries and procedures to effectively terminate dangling bonds and render the surface inactive. For complex multi-constituent materials, finding an appropriate passivation can be extremely challenging, and there is no guarantee that one exists. An example is the case of photodiodes employing either InAs/GaInSb or InAs/InAsSb T2SL absorbers, for which surface leakage currents remain a dominant source of excess dark current in devices with p-type absorbers despite numerous efforts to develop an effective surface passivation chemistry for those systems.

FIG. 3b is a schematic of a diode 305 illustrating an alternative method of reducing surface leakage by using gate electrodes, in the prior art. Specifically, FIG. 3b illustrates the suppression of surface inversion by using gate electrodes to apply an external field under a bias VG. In this method, gate electrodes can be deposited so as to cover the mesa sidewalls, but are prevented from contacting the semiconductor by the presence of an intervening dielectric layer. The dielectric in this case is not optimized for terminating surface states, but rather for electrical isolation to prevent current from flowing from the gate electrode into the semiconductor. A voltage source can be attached to the gate and referenced to the bottom p-contact, and a bias (VG) can be applied to the gate so as to induce an electric field that counters the band bending due to surface states, thereby preventing the formation of a surface channel. However, this method is very challenging to implement on small pitch photodiode arrays, since it requires the fabrication of isolated gate electrodes that conform to the sidewalls of the deep and narrow trenches between neighboring pixels. It also requires an additional source to provide a voltage typically many times that of the diode operating bias to produce an effective gating field. This can be a single voltage source when the gate electrodes are tied together, or many voltage sources if the pixels must be gated individually. Furthermore, the high gate bias serves to amplify the impact of defects or non-uniformities between pixels, degrading uniformity.

Previously, shallow etch mesa isolation (SEMI) has been used as an alternative method of controlling surface leakage, which can employ device and band structure engineering to mitigate the effects of surface states. FIG. 4a is a schematic of a SEMI mesa structure 400. This prior art approach applies to heterojunction photodiodes in which the narrow gap lightly p-type absorber layer is covered by a wider gap SIL that is designed to be slightly thicker than a depletion width, or about 300 nm in one representative example of structures employing InAs/GaInSb absorber layers. On top of the SIL, the wider gap layer is heavily n-doped and continues for another 200 nm to form the cathode at the top of the device structure. Individual photodiode pixels can then be defined by a shallow trench etch that terminates just past the bottom of the cathode layer so that only the cathode and the wider-gap SIL layers are exposed. Since the absorber layer remains buried, no narrow gap materials are exposed to a surface. This effectively suppresses surface leakage because the exposed surface of the wider gap layer is much less susceptible to inversion. In the regions of the surface outside the mesas, it is thus necessary that the surface of the SIL remain near intrinsic or lightly p-type, in which case it will present an electron barrier typically greater than 100 meV, equivalent to about half its bandgap. FIG. 4b is a plot of the bulk conduction and valence band edges for the SEMI mesa structure 400. Specifically, FIG. 4b is a plot of the bandstructure along Path 1 405, indicating the presence of an electron barrier >100 meV high due to the difference in Fermi level in the SIL and absorber.

On the other hand, if the SIL is n-type or its surface does become inverted, the entire surface can form a common n-type electrode and all the diodes are shorted together. The connection to the common p-contact at the bottom of the diodes is typically made using a peripheral trench along the edge of the die, many diffusion lengths away from individual devices so that it does not contribute to the dark current. The limitation of the SEMI arrangement, however, is that it can be susceptible to significant cross-talk between adjacent pixels in an array, since the narrow gap absorber layers in neighboring pixels are not electrically isolated from one another. As the center-to-center distance between pixels (pitch) continues to decrease in focal plane arrays, the ratio of absorber thickness to pixel pitch (aspect) ratio approaches unity can cause high levels of spatial cross-talk. This is where significant numbers of photo-excited minority carriers diffuse to neighboring pixels, strongly degrading the spatial resolution of the SEMI array. Furthermore, the SEMI approach is extremely limited in its applicability to dual band device structures.

Accordingly, there remains a need in the art for a process that reduces surface leakage currents in photodiodes while still effectively isolating neighboring pixels, and which can overcome other limitations of prior art designs.

SUMMARY

According to one aspect of the invention, a device is described that include an absorber layer that can be deposited on top of a bottom contact layer. Furthermore, a semi-intrinsic layer with an energy gap wider than that of the absorber layer can be deposited on top of the absorber layer. A top contact layer can be deposited on top of the semi-intrinsic layer. A conduction band and a valence band energy alignment can be positioned between the absorber layer and the top contact layer, and configured to allow photoexcited minority carriers to be collected while the flow of majority carriers from the absorber are blocked. At least one mesa can be formed by processing and removing layered materials to a depth at least near the bottom of the absorber layer. Finally, a shoulder can be formed in the at least one mesa within the semi-intrinsic layer by processing and removing the layered materials.

According to another aspect of the invention, a method is described for reducing sidewall leakage current. The method can include the steps of depositing an absorber layer on top of a bottom contact layer. A semi-intrinsic layer with an energy gap wider than that of the absorber layer can then be deposited on top of the absorber layer. A top contact layer can then be deposited on top of the semi-intrinsic layer. Next, layered materials can be processed and removed to a depth at least near the bottom of the absorber layer to form at least one mesa. Finally, the layered materials can be processed and removed to form a shoulder in the at least one mesa within the semi-intrinsic layer.

These and other aspects, objects, and features of the present invention will become apparent from the following detailed description of the exemplary embodiments, read in conjunction with, and reference to, the accompanying drawings.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description of the disclosure when considered in conjunction with the drawings, in which:

FIG. 11a is a schematic of a dual band mesa photodiode with the RSEMI structure, in accordance with an exemplary embodiment of the invention.

FIG. 11b is an equilibrium band structure of a dual band photodiode corresponding to the structure in FIG. 11a.

FIG. 12b is an enlargement of the region within the dashed box of FIG. 10a.

DETAILED DESCRIPTION OF EXEMPLARY EMBODIMENTS

Figure 1B:
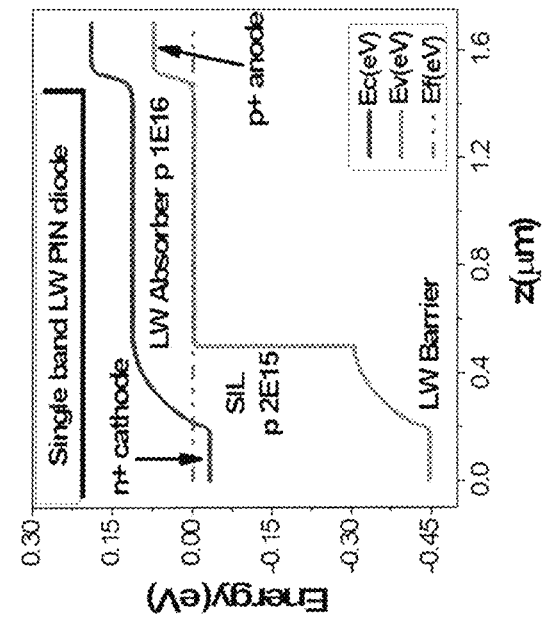
FIG. 1b is a plot of the bulk conduction and valence band edges for a conventional n/p photodiode mesa.

One or more embodiments or implementations are hereinafter described in conjunction with the drawings, where like reference numerals refer to like elements throughout, and where the various features are not necessarily drawn to scale.

In general, the reticulated, shallow etched mesa isolation (RSEMI) structure disclosed herein is designed to completely isolate small-pitch pixels, to avoid spatial cross-talk, while minimizing the surface currents associated with exposed narrow gap material. This is accomplished without any requirement for chemical passivation.

Figure 5:
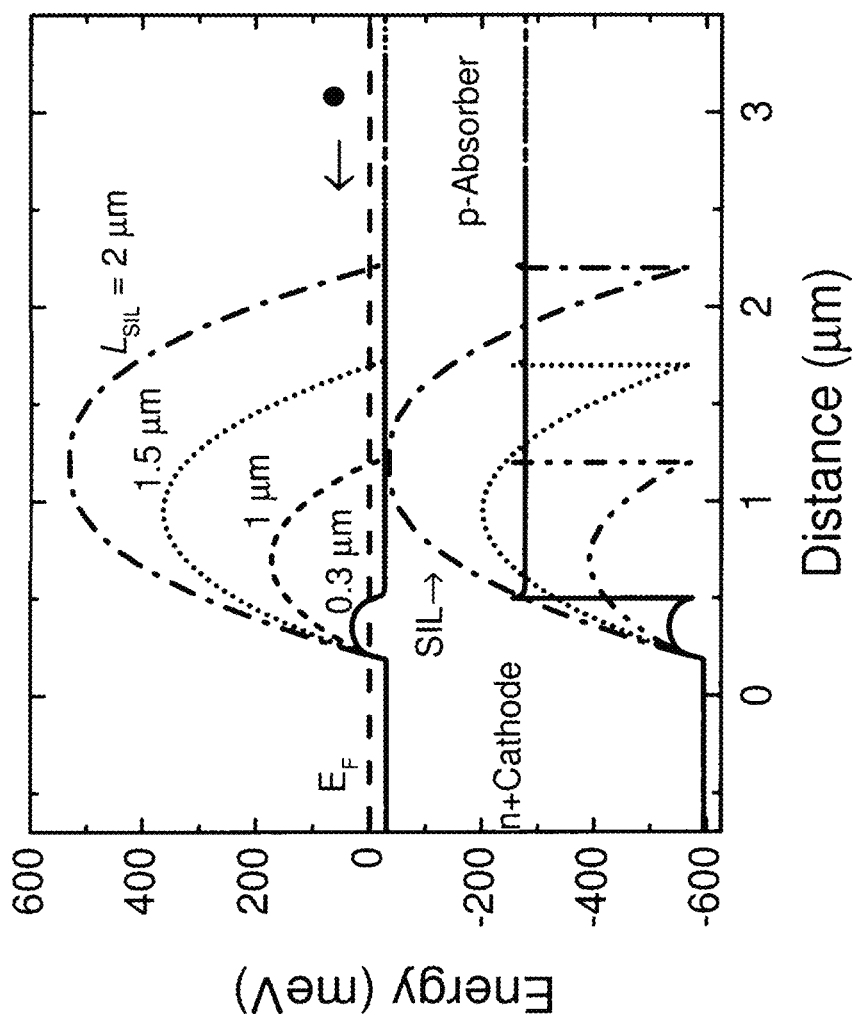
FIG. 5 is a simulation of the conduction and valence band edges for photodiodes with four different thicknesses of the SIL region.

Taking the example of a photodiode with a majority p-type absorber region, the RSEMI concept takes advantage of the consideration that the barrier to electron flow from one n-type region (e.g., the surface inversion layer of the absorber) to another n-type region (e.g., the n+ cathode), via an SIL layer, will increase substantially with increasing thickness of the SIL layer. This is illustrated in FIG. 5, which is a simulation of the conduction and valence band edges for photodiodes with four different thicknesses of the SIL region, illustrating that the height of the barrier with respect to surface electron current increases substantially with increasing SIL thickness. More specifically, FIG. 5 presents simulations (based on solving the Poisson equation) of the change in conduction and valence band profiles as the SIL thickness increases from 0.3 µm to 2 µm.

Figure 2A:
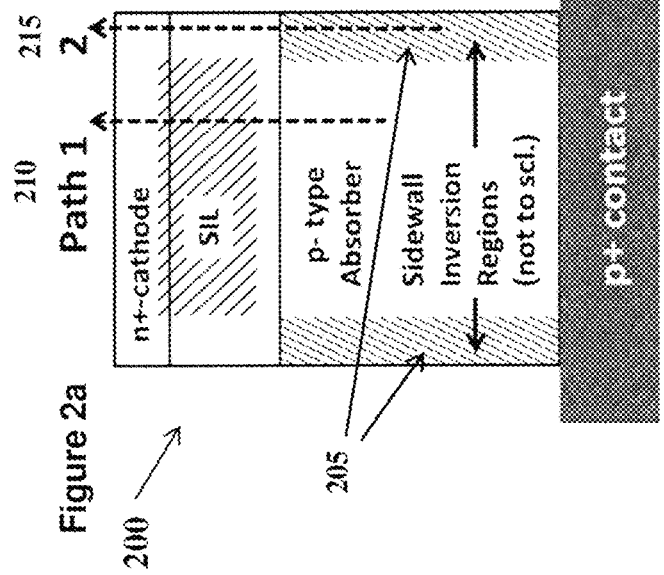
FIG. 2a is a schematic of a conventional n/p photodiode mesa indicating the location of sidewall inversion layers.
Figure 2B:
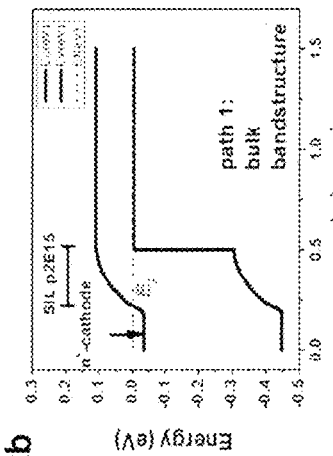
FIG. 2b is a plot of conduction and valence band edges along path 1 deep within the bulk of a conventional n/p photodiode mesa, in which the absorber sidewalls are inverted.
Figure 2C:
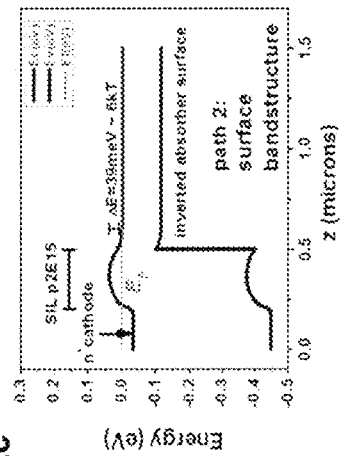
FIG. 2c is a plot of the bulk conduction and valence band edges for a conventional photodiode mesa, which illustrates the effect of the sidewall inversion layers along path 2 near the surface.
Figure 3B:
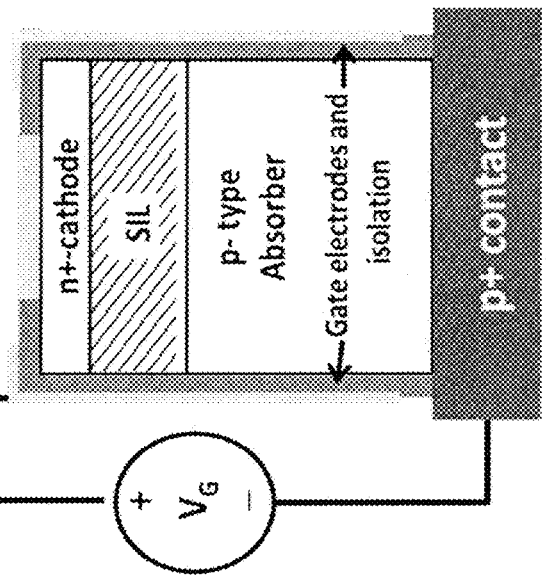
FIG. 3b is a schematic of a photodiode mesa illustrating an alternative method of reducing surface leakage by using gate electrodes.
Figure 3A:
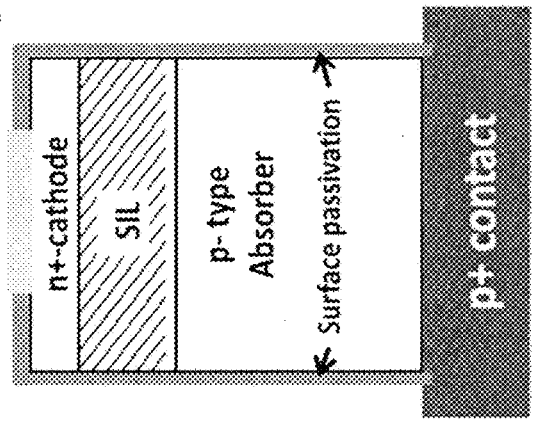
FIG. 3a is a schematic of a photodiode mesa with effective surface passivation and encapsulation used to mitigate the effects of surface states.

In the photodiode of the example, minority carriers (electrons are assumed) are photoexcited in the bulk of the absorber layer and then flow across the depleted SIL into the n+ cathode where they are collected, as in the illustration of FIG. 2b. The SIL is constrained to be no thicker than about its depletion width, which is governed by the doping level in the SIL. Generally, it is favorable for the doping level in the SIL to be as low as possible, as limited by the background or minimum intentionally compensated p-type doping level that can be achieved reliably and reproducibly. In practice, for materials of interest for infrared photodiodes this limits the maximum SIL thickness to about 400 nm. Assuming that the SIL path length at the surface is the same as that in the bulk, which will be the case when the mesa sidewalls are straight as in the conventional geometry of the prior art, the barrier provided by the SIL to surface electron flow from the absorber to the n+ cathode is typically no higher than a few kT (where k is Boltzmann's constant and T is temperature in degrees Kelvin (K)), as in the plot in FIG. 5 for $L_{SIL}$=0.3 µm. It follows that such a small barrier does not significantly impede the leakage associated with the flow of surface electrons. However, the RSEMI geometry differs from the prior art in that it increases the effective width of the SIL region at the surface relative to the corresponding width in the bulk of the same device, as in the curve in FIG. 5 for $L_{SIL}$=2 µm. The invention accomplishes this by introducing a modified mesa sidewall profile that incorporates a "shoulder" near the top of the SIL region. The shoulder serves to lengthen the path length along the surface of the mesa (Path 1 (630) in FIG. 6a) as compared to the corresponding path length within the central bulk region of the mesa (Path 1 (210) in FIG. 2a). Wet or dry etching, or some other process known to one of ordinary skill in the art, may be used to create the shoulder by narrowing the lateral mesa dimensions at the top of the mesa, starting within the SIL, as in the exemplary embodiment of FIG. 6a. However, a shoulder may also be imposed by narrowing the bottom of the mesa, again starting within the SIL, as in the shoulder within SIL2 in the exemplary embodiment of FIG. 8a.

Figure 6B:
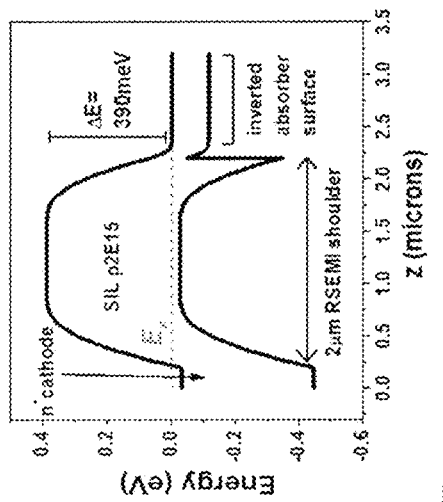
FIG. 6b is a plot of the conduction and valence band edges of the RSEMI device structure, along paths from the sidewall inversion layer to the cathode, in accordance with an exemplary embodiment of the invention.
Figure 6A:
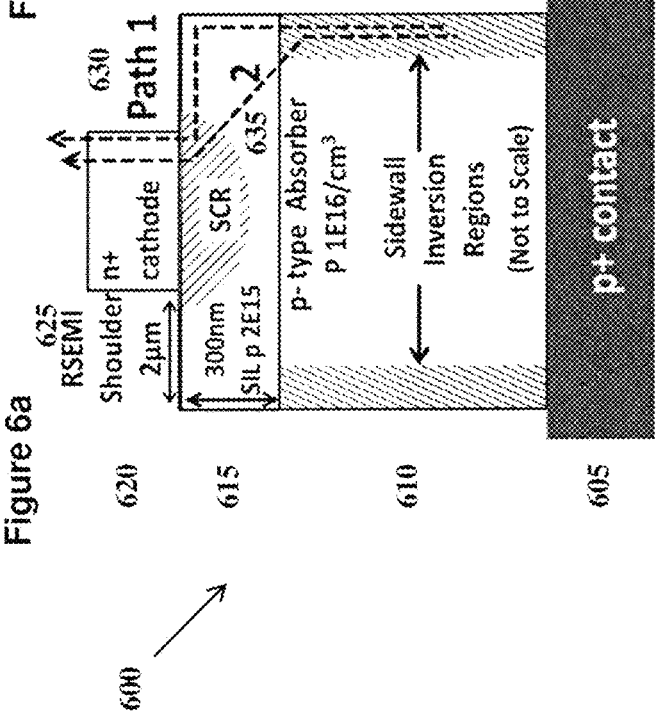
FIG. 6a is a schematic of an RSEMI device structure, in accordance with an exemplary embodiment of the invention, indicating the space charge (SCR) and sidewall inversion regions.

FIG. 6a is a schematic of an RSEMI device structure 600, in accordance with an exemplary embodiment of the invention. Starting from the bottom (i.e., the substrate side), the layering configuration can include a bottom contact 605 (e.g., a p-type); a narrow-gap absorbing layer 610 (e.g., the layer is moderately-p-doped either by intentional or background doping), a wider-gap SIL 615, a more heavily n-doped cathode that comprises the n-side of the p-n junction; and a separately-deposited top metal contact 620. In an exemplary embodiment of the disclosure, it is preferred that the SIL 615 have a net doping level, reached by either unintentional or intentional doping, that is very lightly p-type, but low enough to be near fully depleted at zero bias. In an exemplary embodiment of the disclosure, it is also preferred that the SIL should have an energy gap at least twice that of the absorber region, i.e., $E_g^{SIL} \geq 2E_g^{abs}$, where $E_g^{SIL}$ is the energy gap of the SIL and $E_g^{abs}$ is the energy gap of the absorber. In an exemplary embodiment of the disclosure, the preferred thickness of the SIL 615 is about one depletion width, so that the electric field in the absorber is small. In an exemplary embodiment of the disclosure, it is also preferred that the SIL material be chosen such that the minority carrier energy band of the absorber aligns approximately with the same band in the absorber.

Once the above described layer structure has been grown by an appropriate technique such as by molecular beam epitaxy, the RSEMI structure 600 incorporating a "shoulder", as illustrated in FIG. 6, can be realized by the following fabrication procedures. The wafer, with growth direction z, is first "pixelated", or made into an array of shallow mesas" in the xy plane, by etching shallow "streets," or narrow trenches, only a few hundred nm deep, down to the top surface of the SIL 615. The "streets" are defined along the x and y directions with uniform period equal to $L_p$, the pixel pitch. The width of each "street" is such to accommodate a narrow deep trench, running along its center, while leaving a remnant of the street, 2 microns or more in width around the periphery of the original shallow mesa. The deep trench is etched all the way down to the p-contact layer 605, and so fully reticulates each pixel. This procedure produces an RSEMI "shoulder" 625, a defining characteristic of the exemplary embodiment of the disclosure that is not present in conventional photodiode detector and focal plane array structures. The RSEMI shoulder 625 consists of the "step" formed by the remnant of the shallow street along the periphery of each mesa, terminated by the deep trench sidewall. The surface of the RSEMI shoulder 625 is typically two µm's or more in lateral extent, and consists of an exposed region of the SIL. One of ordinary skill in the art will understand that for other applications the shoulder width can be greater than or less than two µm. In an alternative process flow, this shoulder can be imposed, by instead, first etching the deep isolation trenches down to the p-contact layer 605, and then laterally recessing the top cathode layer of each pixel several depletion widths from the edge of the trench with a shallow etch down to the SIL 615 to, define the RSEMI shoulder 625.

With the n+ cathode layer 620 laterally recessed, the depletion region at the cathode-SIL interface and its associated high electric field is restricted to the central portion of the mesa 600 that is covered by the cathode. Out on the shoulder that is not covered, there is typically a much weaker fringing field that falls off rapidly away from the base of the cathode, where the field lines terminate. The Fermi level on the exposed SIL surface of the RSEMI shoulder 625, is then free to tend toward its mid-gap intrinsic level or valence band for light p-doping, forming a large electron barrier with respect to an n-type surface inversion layer on the absorber sidewall below. In the RSEMI geometry, the bandstructure in the central bulk of the mesa remains the same as that illustrated in FIG. 2b, which enables the photodiode to efficiently collect photoexcited minority carriers. However, the bandstructure at the surface is substantially altered by the RSEMI geometry because there is no straight path along the surface connecting the p-doped absorber region of the device (below the shoulder) with the n+ cathode (above the shoulder), as there was in the conventional geometry of FIG. 2a. FIG. 6b is a plot of bulk conduction and valence band edges of the RSEMI device structure 600, in accordance with an exemplary embodiment of the invention. Specifically, the plot is a simulation of the resulting equilibrium band-structure along the surface (i.e., path 1 630), that includes the lateral extent of the shoulder that must be traversed to reach the n+ cathode. The simulation assumes an InAs/GaInSb LW absorber layer 610 with a 115 meV energy gap, and an InAs/AlInSb SIL 615 and n-contact 620 with 415 meV gap. It can be seen that transport by electrons from the surface inversion layer in the absorber 610 to the cathode 620 can be frustrated by the formation of a large barrier in the SIL 615. This barrier has the properties of that shown schematically in FIG. 5 for the case of $L_{SIL}=2$ μm. In this example, a potential barrier of well over 200 meV blocks the flow of electrons occupying the inversion layer 610 because the RSEMI shoulder region 625 of the SIL 615 that the electrons must traverse is several depletion widths away from the cathode 620, and over a depletion width away from the absorber 610.

Figure 4B:
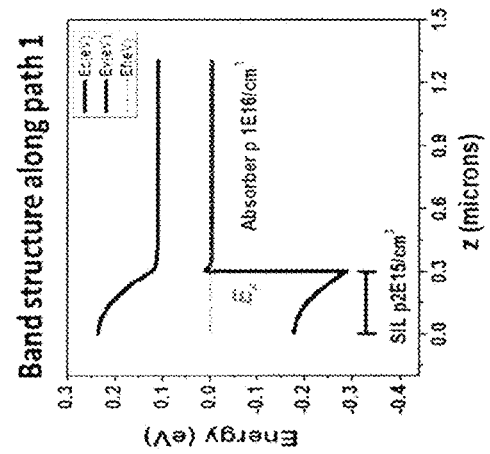
FIG. 4b is a plot of the bulk conduction and valence band edges for the SEMI mesa structure along path 1 projecting through the bulk beside a mesa.
Figure 4A:
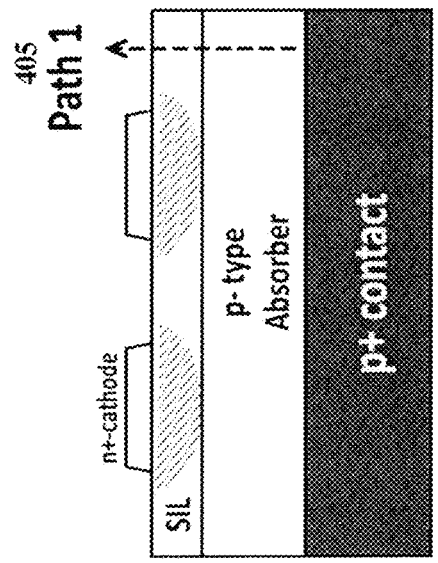
FIG. 4a is a schematic of two mesas defined using shallow etch mesa isolation (SEMI).

As a result, the equilibrium position of the Fermi level in the SIL 615 will tend towards the center of the gap if it is intrinsic, or towards the valence band if it is lightly p-type material. With the Fermi level fixed near the conduction band on the inverted surface of the absorber, the SIL 615 surface presents a large potential barrier to the flow of the surface electrons. The height of this barrier can be determined by the potential drop across the absorber inversion layer 610, equal to its bandgap less the acceptor binding energy, plus the drop across the depletion region in the SIL 615 itself. If the SIL 615 is not pinned by surface states (e.g., Path 2 635 in FIG. 6a), the potential drop across the SIL 615 is similar to that for Path 1 405 in the SEMI architecture 400 (e.g., see FIG. 4b) for regions not covered by the cathode. While the maximum potential height is equal to the difference in Fermi levels, the actual potential barrier in the simulated example is limited to about 100 meV due to the reduced thickness of the partly etched SIL 615. On the other hand, the total potential barrier faced by electrons residing in the surface inversion layer of the absorber 610 is the same for electrons along Path 2 635 in FIG. 6a, as on Path 1 630, and is much greater than 100 meV since the inversion channel is already an absorber bandgap below the conduction band within the interior of the device along any path with a region more than two depletion widths from the cathode 620.

In addition to having the shoulder width be at least 1.5 μm and preferably several depletion widths, as described above, it is also preferable that the etch defining the shoulder 625 should penetrate a minimal distance into the SIL 615, in order to leave at least one depletion width in thickness of the exposed SIL 615 for the reasons described above. It is also critical that the Fermi level of the SIL 615 surface itself is not pinned within or near its conduction band, which would defeat its purpose by preventing the formation of a barrier. The SIL bandgap should preferably be more than twice that of the absorber 610, to present a substantial barrier to majority holes in the absorber bulk, and to lower the intrinsic carrier concentration to reduce bulk generation-recombination current.

For the example of a p-type background doping concentration of 2E15 cm$^{-3}$ in the SIL 615 of the exemplary embodiment, a SIL 615 thickness of 300 nm and a shoulder width of about 2 μm can be sufficient to create an adequate electron barrier in the SIL 615 for a reasonable range of cathode (n$^+$), and absorber (low-p) doping levels. While a bias may be required to operate the RSEMI detector 600 with ideal band alignments and doping levels, the required bias will be relatively small. In the bulk bandstructure of the preferred embodiments, such as that shown in FIG. 2b, the n-type cathode layer 620 also has an energy gap of more than twice that of the absorber region 610, and its conduction band aligns approximately with that of the SIL 615. One way to ensure that these requirements are met is to use the same material constituents for the n-type cathode 620 and the SIL 615.

In summary of the exemplary embodiment of FIG. 6a, a RSEMI device structure 600 is described that includes an absorber layer 610 that can be deposited on top of a bottom contact layer 605. Furthermore, a semi-intrinsic layer 615 with an energy gap wider than that of the absorber layer 610 can be deposited on top of the absorber layer 610. A top contact layer 620 can be deposited on top of the semi-intrinsic layer 615. A conduction band and a valence band energy alignment can be positioned between the absorber layer 610 and the top contact layer 620, and configured to allow photoexcited minority carriers to be collected while the flow of majority carriers from the absorber are blocked. At least one mesa can be formed by processing and removing layered materials to a depth at least near the bottom of the absorber layer 610. Finally, a shoulder 625 can be formed in the at least one mesa within the semi-intrinsic layer 615 by processing and removing the layered materials, or the material is removed by etching to form a mesa and a shoulder 625. In an exemplary embodiment of the invention, a sidewall leakage current of the device 600 can be reduced without chemically passivating the surfaces of the device 600.

Additional exemplary features of the exemplary RSEMI device structure 600 include the absorber layer 610 having a net doping level that is p-type, and the surface inversion layer has a net doping level that is n-type. Furthermore, the energy gap of the semi-intrinsic layer 615 can be at least two times that of the absorber layer 610. The thickness of the semi-intrinsic layer 615 can be approximately one depletion width. The shoulder 625 can be imposed by incorporating one or more additional masking and etching steps into the processing procedure of the device 600. In addition, the shoulder 625 can be wide enough to present a significant barrier to the leakage current flowing along the sidewall of the mesa, and the shoulder 625 width can be at least 1.5 The etch defining the shoulder 625 can penetrate a minimal distance into the semi-intrinsic layer 615.

The device 600 can function as a photodiode with the semi-intrinsic layer 615 serving as a depletion region in the middle of a p-n junction, and wherein a top contact 620 and a bottom contact 605 have opposite doping types. Alternatively, the device 600 can function as an pBp detector with the semi-intrinsic layer 615 serving as a barrier to current flow by the majority carriers, and wherein a top contact 620 and a bottom contact 605 both have a p-type doping. The absorber layer 610 can also have a sidewall surface that can be inverted when the material is processed to form the mesa.

One of ordinary skill in the art will understand that the structure described with respect to FIG. 6a is an exemplary embodiment of the disclosure, and that numerous variations in the materials, layering, band alignments, and mesa profile may be introduced while still maintaining the essential ingredients of the exemplary embodiment of the disclosure as a means for suppressing surface leakage currents. The specified layers may be grown by molecular beam epitaxy (MBE), metal-organic chemical vapor deposition (MOCVD), or some other process known to those skilled in the art. In addition, other processing sequences may be used to achieve the final structure. A simple variant, for example, would be to reverse the device polarity such that there is a lightly n-doped absorber with a p$^+$ anode on top, as when it is desired to have holes as the minority carriers. In this case, the SIL formed by a very low n-doped region of the wider gap p$^+$ anode material would block transport from an inversion layer of holes on the exposed absorber surface.

In an alternative exemplary embodiment of the disclosure, the RSEMI structure 600 can also be suitable for suppressing surface leakage currents in unipolar devices such as the so-called nBn and analog pBp structures that rely on band offsets to form barriers that block majority carriers. In "nBn" devices, a thin "barrier" layer is interposed between a lightly n-type, thick narrow gap absorber and a thin n+-doped region of the same, or different, material forming the top contact. The barrier layer can be designed to have a large band offset with respect to the majority carrier conduction band, while having its valence band aligned with that of the absorber and contact. With this arrangement, only thermally and photo-excited minority carriers can traverse the structure unless there are defects that somehow compromise the barrier. This is the case when surface states promote the formation of inversion layers on the absorber and contact surfaces, allowing the barrier to be bypassed. In this alternative exemplary embodiment, the RSEMI structure 600 may be applied to the "nBn" device, with the barrier playing the role of the SIL and the e contact layer recessed several depletion widths in from the mesa edge. Provided that the barrier has a light n-background and is close to a depletion width in thickness, and the surface of the barrier itself is not pinned, a substantial barrier to the surface hole channel can be realized in the region of the barrier forming the RSEMI shoulder, analogous to that illustrated in FIG. 5a for the case of a surface electron channel in a PIN heterojunction diode.

Figure 7B:
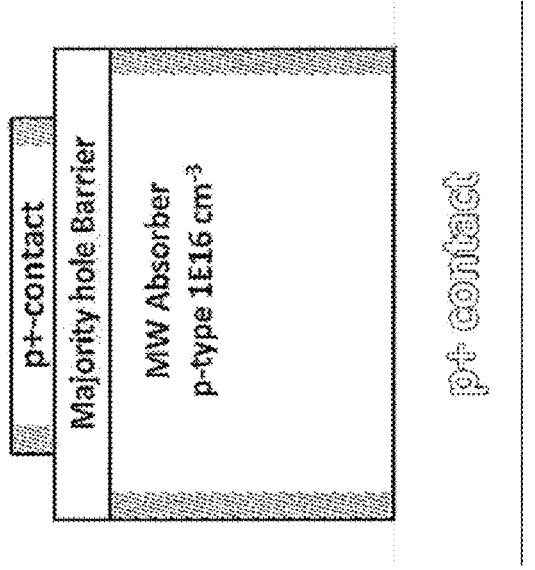
FIG. 7b is a "pBp" detector with the R-SEMI etch recessing the p+ contact on the hole barrier, in accordance with an exemplary embodiment of the invention.
Figure 7A:
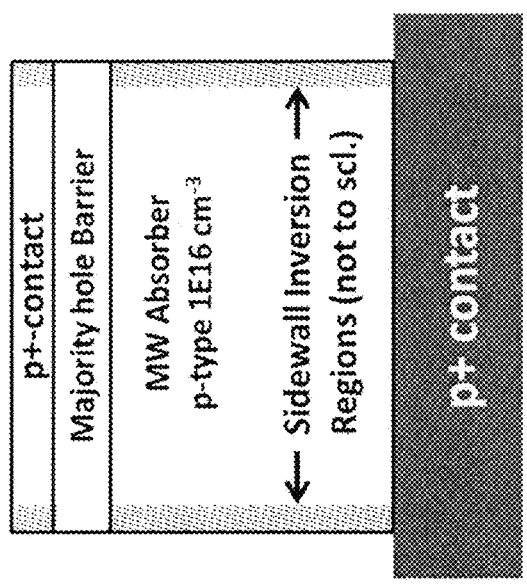
FIG. 7a is a "pBp" detector with conventional SDEI etch with inversion regions on sidewalls.

FIG. 7a is a "pBp" detector with conventional SDEI etch with inversion regions on sidewalls. This structure has high surface leakage. Alternatively, FIG. 7b is a "pBp" detector with R-SEMI etch recessing p+ contact on hole barrier, in accordance with an exemplary embodiment of the invention. This structure reduces surface leakage.

Figure 8B:
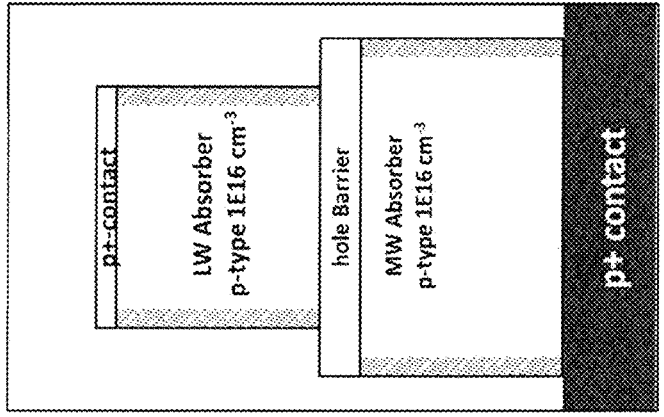
FIG. 8b is a schematic of an RSEMI structure, in accordance with an alternative exemplary embodiment of the invention as applied to a dual-band sensor composed of a pBp structure.
Figure 8A:
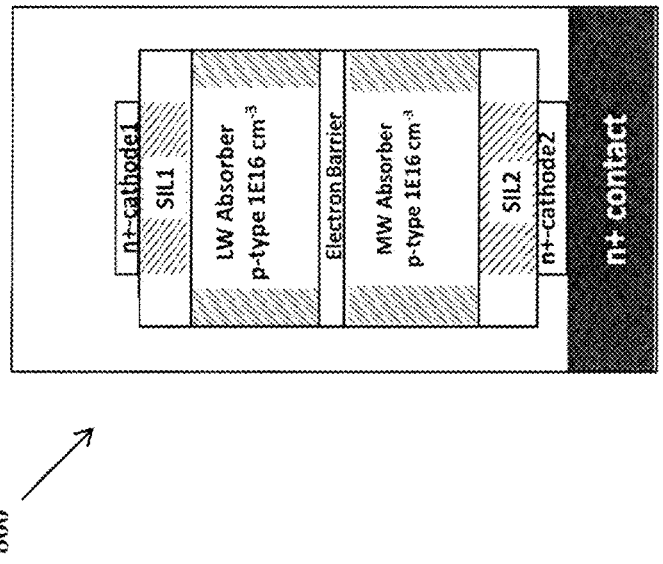
FIG. 8a is a schematic of an RSEMI structure, in accordance with an alternative exemplary embodiment of the invention as applied to a dual-band sensor composed of back to back n/p-p/n photodiodes.

FIG. 8a is a schematic of an RSEMI structure 800, in accordance with an alternative exemplary embodiment of the invention. Specifically, FIG. 7a is a further generalization of the technique described above that can apply to dual band or inverted devices that contain a second absorber-SIL interface at the bottom of the structure. In this case, as illustrated in FIG. 8a, surface leakage across both junctions may be suppressed by recessing both the top and bottom contact layers using advanced fabrication techniques such as those developed for micro-electromechanical systems (MEMS). Similarly, FIG. 8b is a schematic of an RSEMI structure, in accordance with an alternative exemplary embodiment of the invention as applied to a dual-band sensor composed of a pBp structure. More specifically, the schematic in FIG. 8b illustrates the use of the RSEMI structure to suppress surface leakage in a dual band "pBp" structure.

As will be described below, application of the RSEMI device 600 to T2SL detector structures can result in a strong reduction of surface leakage currents; and, thereby, greatly improve the IR detector noise characteristics. The improvement can manifest in a greater than 100-fold increase in surface resistivity observed in RSEMI devices compared to those defined using SDEI. The barrier produced in the SIL under RSEMI can be highly effective in impeding the flow of minority electrons in the surface channel surrounding the narrow-gap absorber to the cathode, as normally occurs using SDEI.

The exemplary RSEMI structure 600 has been tested on many different InAs/GaInSb T2SL heterostructure diode wafers with varying designs and material quality, and has been observed to be consistently effective in lowering surface currents. For example, FIG. 9 shows results for the RSEMI structure 600 applied to long wave (LW) single band (SB) T2SL PIN photodiodes with n+-doped (n≈4e17) cathodes and undoped SILs composed of AlInAs/InAs T2SLs.

Figure 1A:
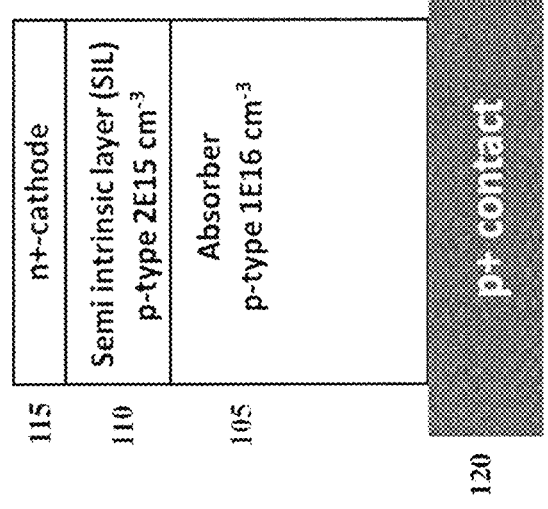
FIG. 1a is a schematic of a conventional n-on-p (n/p) photodiode mesa, which may represent a single pixel in an array.

The SIL and contact layers of these devices were designed to have a bandgap of 365 meV at 78 K, and that of the p-doped (p≈1e16) GaInSb/InAs T2SL absorber layers, 128 meV. The absorber and SIL/contact superlattices were further designed so that the large difference in bandgap was taken up almost entirely by the discontinuity in the valence band at the absorber-SIL interface, while the conduction bands remained nearly aligned. The RSEMI layer structure and the energy band diagram of the device are similar to those represented in FIG. 1.

Figure 9B:
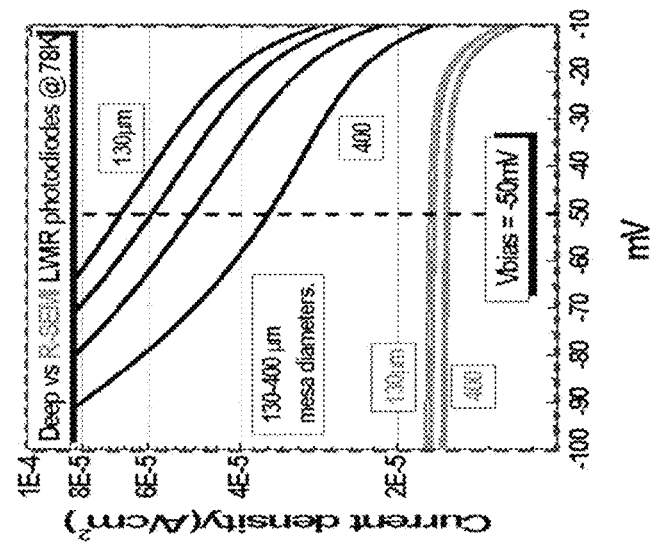
FIG. 9b is an enlargement of the J-V traces in FIG. 9a in the vicinity of the operating bias, in accordance with an exemplary embodiment of the invention.
Figure 9A:
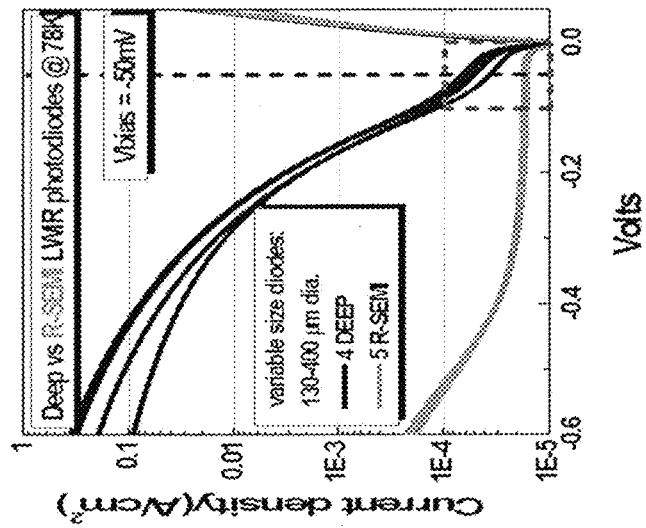
FIG. 9a shows current-voltage plots comparing single deep etch isolated (SDEI) photodiode mesas with RSEMI photodiodes of varying sizes, processed together on the same chip, in accordance with an exemplary embodiment of the invention.

To prove the effectiveness of the RSEMI invention, a test bar consisting of 29 sensors with 10 μm-wide RSEMI shoulders and 29 control sensors with conventional SDEI structure was fabricated from this material. Additionally, each test die was fabricated using a single mask so that the SDEI and RSEMI devices shared the same cleaning, photolithography, wet etch, and metallization processing steps. In FIG. 9a, current-voltage plots of single deep etch isolated (SDEI) diodes are compared with those of RSEMI diodes of varying size, processed together on the same chip, in accordance with exemplary embodiment of the invention. Specifically, the current density vs. voltage (J-V) curves for RSEMI and SDEI devices at T=78 K in FIG. 9a, show that the total current density is much higher for diodes with the conventional mesa profile compared to those using the RSEMI structure. FIG. 9b is an enlargement of the J-V traces near the operating bias in FIG. 9a in accordance with an exemplary embodiment of the invention. Specifically, FIG. 9b is an enlargement of the dashed box as shown in FIG. 9a) to highlight the contrast in overall current density, the slope dJ/dV (conductance per unit area), and the variation with respect to mesa diameter, between the device structures.

Analysis of the dependence of the J-V data on perimeter-to-area ratio (P/A) for diodes of varying size indicates that the higher current density is associated with high surface leakage in the SDEI mesa devices. This follows from a simple model where the measured diode current I is taken to be composed of bulk and surface current densities ($J_{bulk}$ (A/cm$^2$) and $J_{surf}$ (A/cm)) with $$I = A \cdot J_{bulk} + P \cdot J_{surf} \qquad \text{eqn. 1}$$

Here A is the mesa area (cm$^2$) and P is the length of the mesa perimeter (cm). Dividing by the diode area, yields $$J = J_{bulk} + P/A \cdot J_{surf} \qquad \text{eqn.2}$$

Figure 10A:
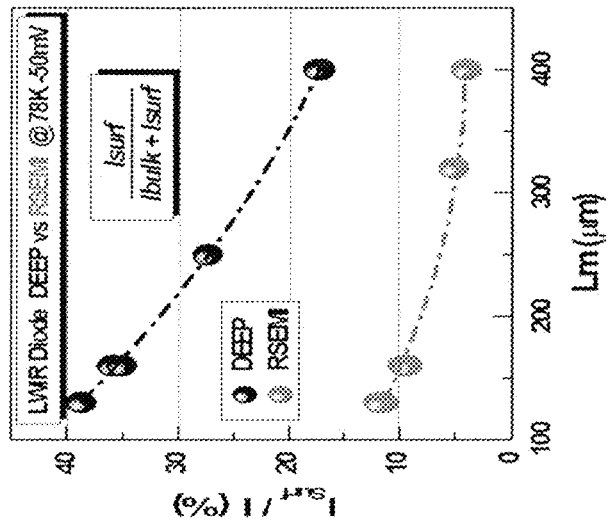
FIG. 10a is a plot of overall current density at operating bias $J_b = J(V_{bias})$ vs. P/A to extract bulk and surface current densities, $J_{bulk}(A/cm^2)$ and $J_{surf}(A/cm)$.

The bulk and surface current densities may then be extracted by a linear fit of $J_b$ vs. P/A, where $J_b$ is the current density at the operating bias, $V_{bias}$, as shown in FIG. 10(a). Specifically, FIG. 10(a) is a plot of overall current density at operating bias $J_b = J(V_{bias})$ vs. P/A to extract bulk and surface current densities, $J_{bulk}$ (A/cm$^2$) and $J_{surf}$ (A/cm). Here, the fitting yields more than a factor of ten times higher surface current density ($J_{surf}$) on the SDEI diodes compared to the RSEMI structures. Similarly, the surface conductance ($G_{surf}$ (S/cm)), extracted from fitting the dependence of dJ/dV on P/A, is more than 400 times higher in the SDEI devices.

Figure 10B:
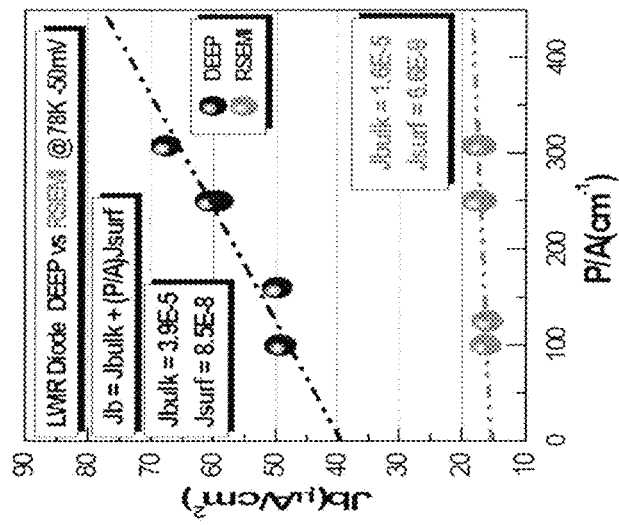
FIG. 10b is a plot of the contribution of surface leakage as a fraction of the total current as a function of mesa diameter.

In devices with high surface leakage, the fractional contribution of surface current ($F_{surf}$) tends to show a strong dependence on mesa size $$F_{surf}(\%) = \frac{I_{surf}}{I_{bulk} + I_{surf}} \qquad \text{eqn. 3}$$

with the surface current quickly becoming dominant, as the devices get smaller. This is evident in FIG. 10(b), which is a plot of fractional contribution of surface leakage to total current as a function of mesa diameter. Specifically, $F_{surf}$ is shown as a function of mesa diameter $L_m$ (cm) for SDEI and RSEMI diodes. Here it can be seen that surface leakage in SDEI devices typically start to exceed 40% of the total current as mesa diameters fall below 100 µm, boding poorly for this approach on focal plane arrays where pixel pitch is typically 25 µm and less.

Figures 11A, 11B:
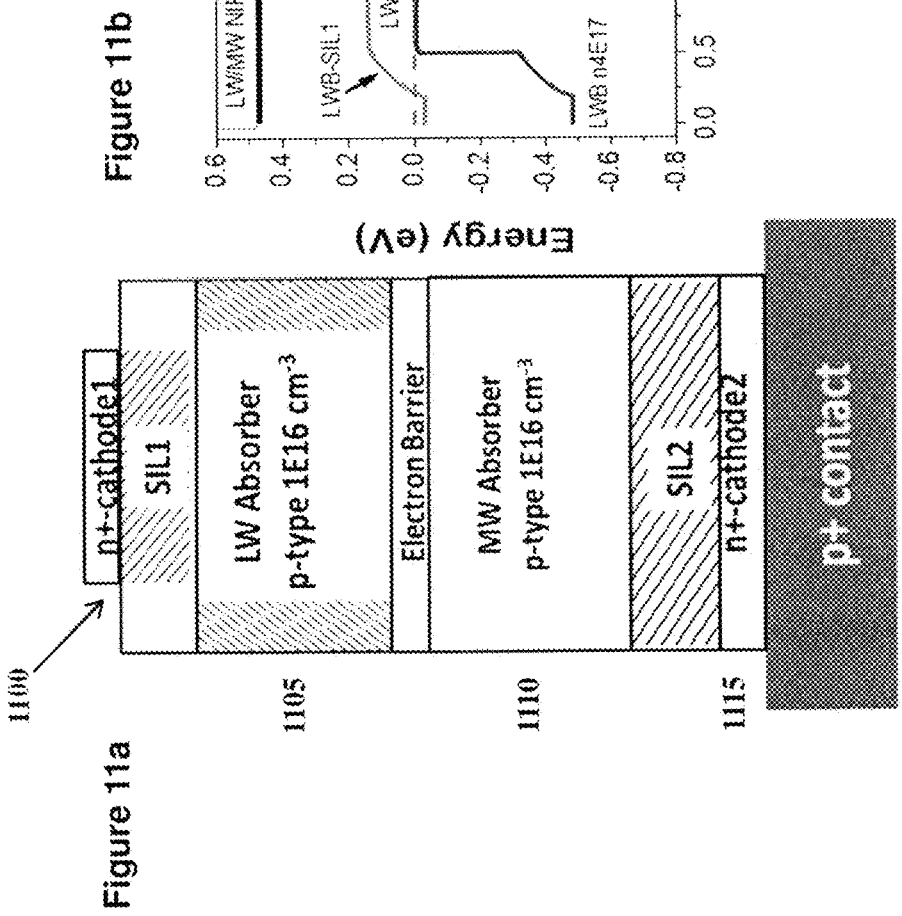

Additionally, the efficacy of the RSEMI structure has been demonstrated on long/mid-wave (LW/MW) dual band infrared sensors. FIG. 11a is a schematic of a dual band mesa diode 900 with RSEMI structure, in accordance with an exemplary embodiment of the invention. In FIG. 11a, the inversion layers and space charge region (SCR) are indicated by shading. In a dual band device 1100, the exemplary RSEMI structure can provide the unique ability to enable shallow-etch passivation of the LW junction 1105 while fully isolating the MW bands 1110 of neighboring pixels.

FIG. 11b is an equilibrium band structure of a dual band diode corresponding to the structure 1100 in FIG. 11a. The top contact of the diode is at the left and the substrate (not shown) is at the right. Specifically, FIG. 11a illustrates the RSEMI layer structure and the energy band diagram of the back-to-back LWIR/MWIR dual band PIN (DPIN) T2SL infrared sensor. The top half of the DPIN structure is identical to that of the LW SB detector, and RSEMI is implemented exactly as discussed herein, with the exception that the deep isolation etch is carried all the way through the MW junction 1110 to the bottom n-contact 1115. In this way, surface current is suppressed at the longwave junction while the MW devices are fully isolated from one another. The surface leakage current for the MW device is already strongly suppressed by its much wider bandgap and the necessity of operating the DPIN photodetector at a low temperature (e.g., 78K or lower) to accommodate the LW junction. Still, it is possible to apply RSEMI surface current suppression to both junctions, by implementing the structure previously depicted in FIG. 8, in which the lower n-contact is also recessed.

Figure 12A:
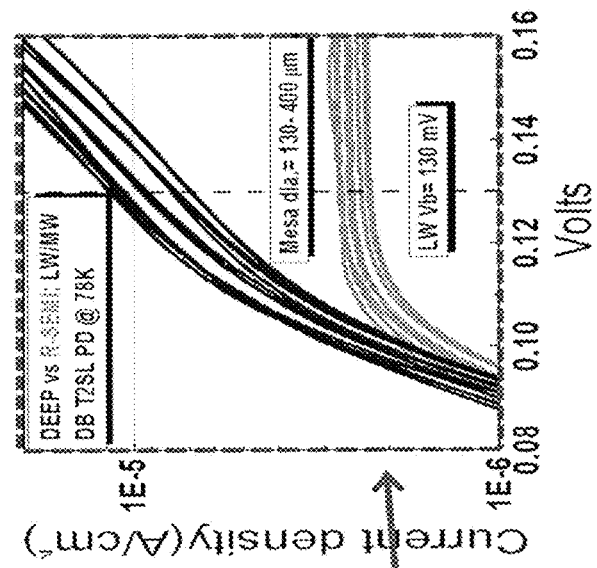
FIG. 12a is a plot of the J-V curves for RSEMI and SDEI devices processed from the same representative testing sample.
Figure 12B:
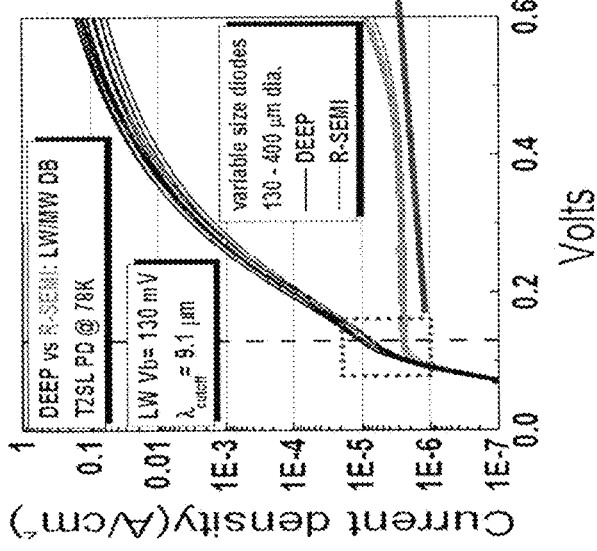

To further prove the effectiveness of the RSEMI geometry, in a testing environment, a mask set, similar to that described for the single band device wafers, was used to fabricate test bars that included 16 dual band sensors with 5 µm RSEMI-shoulder widths and 16 dual band sensors with conventional SDEI structure. FIG. 12a is a plot of the J-V curves for RSEMI and SDEI devices at T=78 K for a representative testing sample. In FIG. 12a, it can be seen that, just as for single band devices, the overall current density is strongly reduced at voltages greater or equal to the operating bias in devices using the RSEMI structure as represented by the "flatter" traces. FIG. 12b is an enlargement of the region within the dashed box of FIG. 12a, which shows that RSEMI can be used to obtain higher impedance and lower variation with respect to mesa diameter than SDEI in dual band device structures.

Figure 13A:
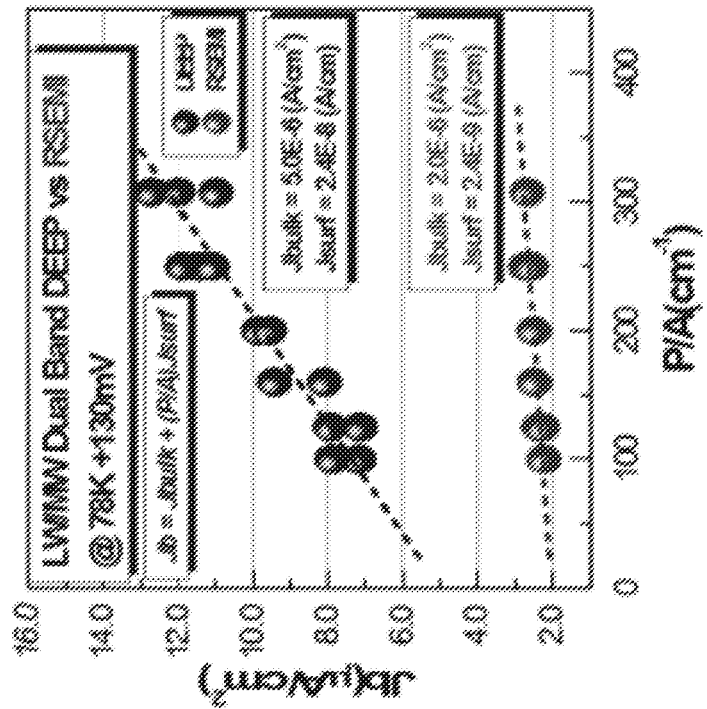
FIG. 13a represents fits of the overall current density at operating bias $J_b = J(V_{bias})$ vs. P/A to extract the bulk and surface current densities.
Figure 13B:
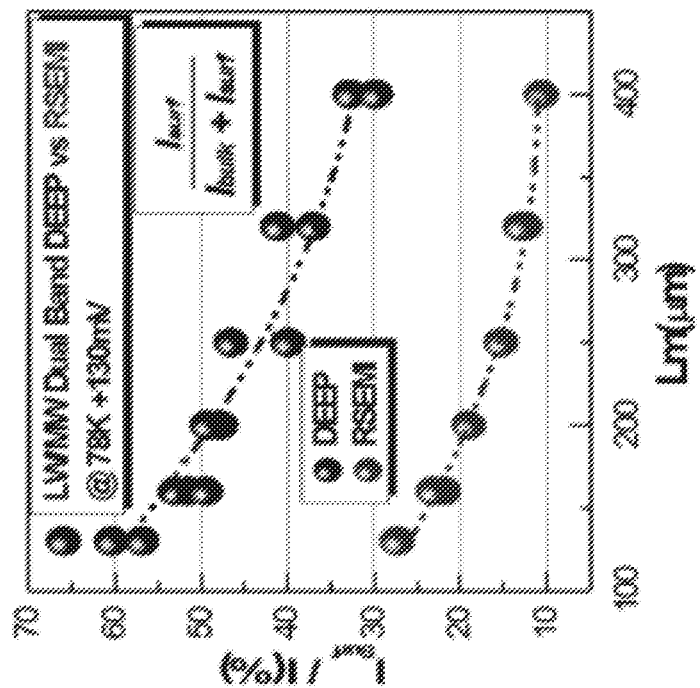
FIG. 13b represents the fractional contribution of surface leakage to the total current as a function of mesa diameter.

FIG. 13a represents fits of overall current density at operating bias $J_b=J(V_{bias})$ vs. P/A to extract bulk and surface current densities, $J_{bulk}$ (A/cm$^2$) and $J_{surf}$ (A/cm) in LW/MW dual band devices. In FIG. 13a, bulk and surface current densities extracted from a linear fit of $J_b$ vs. P/A show a factor of ten times higher surface current density in the SDEI devices. FIG. 13b plots the fractional contribution of surface leakage to total current as a function of mesa diameter, showing that RSEMI devices remain bulk limited below 100 µm mesa-diameters, while surface leakage comprises over 50% of the total current in dual band SDEI-devices below 200 µm mesa-diameters. Furthermore, FIG. 13b shows that the differential surface conductance is more than 20 times higher in the SDEI structure.

Overall, the RSEMI structure can reduce surface leakage currents in diodes while still effectively isolating neighboring diodes. The RSEMI structure can suppress surface leakage currents by creating an energy barrier between the majority carriers in the sensor contact, and an inversion layer on the surface of the absorber. The structure can be expected to be effective in single band PIN and dual band DPIN junction devices, and in single and dual band nBn or pBp structures. Furthermore, the RSEMI structure is compatible with passivation if that is required for other reasons, though passivation is not required for the RSEMI structure to be effective. For example, an encapsulating material may be used to protect the surface from further processing steps, even though it may not play any role in mitigating surface states on the mesa sidewalls.

In an alternative exemplary embodiment of the invention, the RSEMI structure can be produced by any lithographic process compatible with the layered semiconductors, with the multiple etch steps required to produce the "shoulder", and with the feature sizes required. For example, the lithography in the devices tested above can be performed using acid-based wet etching; however, the invention is equally applicable to devices processed with dry, reactive ion etching with reactive energetic plasmas.

In an alternative exemplary embodiment of the invention, the RSEMI structure can also be effective in diodes where the bandgap of the SIL is graded. In this case, the second etch that defines the shoulder can be stopped within the SIL depletion region, preferably in the layer with the widest gap.

In an alternative exemplary embodiment of the invention, the RSEMI structure can also prove effective in unipolar sensor structures that employ a majority carrier barrier (nBn and pBp) rather than a junction to suppress the dark current. In this embodiment, the effect of Fermi level pinning in the narrow gap absorber can be mitigated by recessing the upper contact several depletion widths from the edge of the outer mesa with the majority carrier barrier playing the role of the SIL.

In an alternative exemplary embodiment of the invention, the RSEMI structure can also prove effective in both bipolar (PIN) and unipolar (nBn and pBp) photodiodes that employ "Ga-free" InAs/InAsSb or other related absorber regions as illustrated in Figure X.

In an alternative exemplary embodiment of the invention, the RSEMI structure may also be used in certain dual band infrared detectors. FIG. 11 illustrates the RSEMI structure application to a dual band detector composed of back-to-back diodes, where the recessed shoulder geometry of the RSEMI structure is employed on the upper diode in similar fashion to its use on single band devices, as previously described in FIG. 6. Its prospective use on both junctions of a dual band device structure is illustrated in FIG. 8 by using an appropriate etchant to selectively undercut the contact below the bottom SIL. As in the other applications, the efficacy of the RSEMI structure does not depend on the polarity of the diodes, i.e., if the n-layers in the figure become p-layers and the p-layers become n-layers.

Other types of diode devices, such as solar cells, thermoelectrics and photovoltaics may also potentially benefit from application of the RSEMI geometry to suppress surface leakage currents.

It should be understood that the foregoing relates only to illustrative embodiments of the present invention, and that numerous changes may be made therein without departing from the scope and spirit of the invention as defined by the following claims.

The invention claimed is:

1. A semiconductor device having reduced sidewall leakage current, comprising:
   a bottom contact layer;
   an absorber layer disposed on top of the bottom contact layer, the absorber layer having surface channels along the sidewalls thereof;
   a semi-intrinsic layer having an energy gap wider than that of the absorber layer disposed on top of the absorber layer; and
   a top contact layer disposed on top of the semi-intrinsic layer;
   a conduction band and a valence band energy alignment between the absorber layer and the top contact layer being configured to allow photoexcited minority carriers to be collected while the flow of majority carriers from the absorber are blocked;
   wherein the top contact layer, the semi-intrinsic layer, and the absorber layer are etched to form at least one mesa on top of the bottom contact layer; and
   wherein the top contact layer is further etched to expose a predetermined portion of the top of the semi-intrinsic layer, forming a recessed top contact layer whose sides are recessed from sidewalls of the semi-intrinsic layer, the exposed top of the semi-intrinsic layer and the side of the recessed top contact layer forming a shoulder in the mesa, the shoulder having a predetermined width along the exposed portion of the semi-intrinsic layer;
   wherein a presence of the shoulder creates a potential barrier between the top contact and surface channel on the absorber sidewall that impedes the flow of current from the surface channel in the absorber to the top contact layer, a presence of the potential barrier reducing sidewall leakage current in the device; and
   wherein the width of the shoulder along the top of the semi-intrinsic layer is configured to provide a predetermined reduction in the sidewall leakage current in the device.

2. The device of claim 1, wherein the surfaces of the device are not chemically passivated to reduce the sidewall leakage current of the device.

3. The device of claim 1, wherein the absorber layer has a net doping level that is p-type, and the surface channel has a net doping level that is n-type.

4. The device of claim 1, wherein the energy gap of the semi-intrinsic layer is at least two times that of the absorber layer.

5. The device of claim 1, wherein a thickness of the semi-intrinsic layer is approximately one depletion width.

6. The device of claim 1, wherein the shoulder can be imposed by incorporating one or more additional masking and etching steps into the processing procedure of the device.

7. The device of claim 1, wherein the width of the shoulder along the top of the semi-intrinsic layer is at least one depletion width of semi-intrinsic layer so as to present a significant barrier to the leakage current flowing along the sidewall of the mesa.

8. The device of claim 1, wherein the width of the shoulder along the top of the semi-intrinsic layer is at least 1.5 µm.

9. The device of claim 1, wherein the etch defining the shoulder penetrates a minimal distance into the semi-intrinsic layer so the semi-intrinsic layer retains a thickness of about one depletion width.

10. The device of claim 1, wherein the device is a photodiode in which the top contact layer and the bottom contact layer have opposite doping types; and wherein the semi-intrinsic layer serves as a depletion region in the middle of a p-n junction formed by the top and bottom contact layers.

11. The device of claim 1, wherein the device is a pBp detector in which the top contact layer and the bottom contact layer both have a p-type doping; and wherein the semi-intrinsic layer serves as a barrier to current flow in the surface channel.

12. A method for fabricating a semiconductor device having reduced sidewall leakage current, comprising the steps of:
    depositing an absorber layer on top of a bottom contact layer, the absorber layer having surface channels along the sidewalls thereof;
    depositing a semi-intrinsic layer having an energy gap wider than that of the absorber layer on top of the absorber layer;
    depositing a top contact layer on top of the semi-intrinsic layer;
    etching the top contact layer, the semi-intrinsic layer, and the absorber layer to form at least one mesa on top of the bottom contact layer; and
    further etching the top contact layer to expose a predetermined portion of the top of the semi-intrinsic layer, forming a recessed top contact layer whose sides are recessed from sidewalls of the semi-intrinsic layer, the exposed top of the semi-intrinsic layer and the side of the recessed top contact layer forming a shoulder in the mesa, the shoulder having a predetermined width along the exposed portion of the semi-intrinsic layer;
    wherein a presence of the shoulder creates a potential barrier between the top contact and surface channel on the absorber sidewall that impedes the flow of current from the surface channel in the absorber to the top contact layer and reduces sidewall leakage current in the device; and
    wherein the width of the shoulder along the top of the semi-intrinsic layer is configured to provide a predetermined reduction in the sidewall leakage current in the device.

* * * * *